United States Patent
Fujiwara et al.

(10) Patent No.: US 9,933,478 B2
(45) Date of Patent: Apr. 3, 2018

(54) PROBE CARD AND HAVING OPPOSITE SURFACES WITH DIFFERENT DIRECTIONS AND TEST APPARATUS INCLUDING PROBE CARD THEREOF

(71) Applicant: Toshiba Memory Corporation, Minato-ku (JP)

(72) Inventors: Tomoko Fujiwara, Kanagawa (JP); Takao Sueyama, Kanagawa (JP); Keiko Kaneda, Chiba (JP); Michiko Ego, Saitama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 37 days.

(21) Appl. No.: 15/060,856

(22) Filed: Mar. 4, 2016

(65) Prior Publication Data

US 2016/0291055 A1 Oct. 6, 2016

(30) Foreign Application Priority Data

Mar. 30, 2015 (JP) ................................ 2015-070399

(51) Int. Cl.
G01R 31/00 (2006.01)
G01R 31/28 (2006.01)
G01R 1/073 (2006.01)

(52) U.S. Cl.
CPC ..... G01R 31/2874 (2013.01); G01R 31/2863 (2013.01); G01R 1/07342 (2013.01); G01R 1/07371 (2013.01)

(58) Field of Classification Search
CPC ............ G01R 1/07342; G01R 31/2889; G01R 1/07378; G01R 31/2891; G01R 31/2886; G01R 1/06727; G01R 31/2863; G01R 1/06744; G01R 1/073; G01R 1/07314; G01R 1/06733; G01R 1/06738; G01R 1/07307; G01R 1/06711; G01R 1/06722; G01R 1/07357; G01R 1/07371; G01R 31/2865; G01R 31/2884; G01R 1/0491; G01R 1/0735; G01R 1/18; G01R 31/2851; G01R 31/2875; G01R 31/31905; G01R 1/0408; G01R 1/0416; G01R 1/0675; H01R 12/52; H01R 13/24; H01R 12/7082; H01R 12/714; H01R 13/2435; H01R 13/2464; H01R 13/2485; H01R 13/6215;

(Continued)

(56) References Cited

U.S. PATENT DOCUMENTS

2003/0094962 A1 5/2003 Rincon et al.
2004/0090223 A1* 5/2004 Yonezawa .......... G01R 31/2889
324/756.03

(Continued)

FOREIGN PATENT DOCUMENTS

JP 10-221373 8/1998
JP 2007-188972 7/2007
JP 2009-2865 1/2009

*Primary Examiner* — Vinh Nguyen
(74) *Attorney, Agent, or Firm* — Oblon, McClelland, Maier & Neustadt, L.L.P.

(57) ABSTRACT

A probe card includes a probe; and a probe card substrate which includes a first member and a second member, the first member having a first surface provided with the probe and the second member having a second surface surrounding the first surface, wherein a direction of the first surface is different from a direction of the second surface.

24 Claims, 7 Drawing Sheets

(58) Field of Classification Search
CPC ......... H01R 43/00; H01R 9/096; G01L 5/162; G01L 5/223
See application file for complete search history.

(56) References Cited

U.S. PATENT DOCUMENTS

| | | | | |
|---|---|---|---|---|
| 2007/0296422 A1* | 12/2007 | Miller | ................ | G01R 31/2889 324/754.07 |
| 2009/0128178 A1* | 5/2009 | Matsuzawa | ........ | G01R 31/2891 324/762.05 |
| 2011/0291687 A1* | 12/2011 | Kim | ................... | G01R 1/07314 324/756.03 |

* cited by examiner

PROBE CARD AND HAVING OPPOSITE SURFACES WITH DIFFERENT DIRECTIONS AND TEST APPARATUS INCLUDING PROBE CARD THEREOF

CROSS-REFERENCE TO RELATED APPLICATIONS

This application is based upon and claims the benefit of priority from Japanese Patent Application No. 2015-70399, filed Mar. 30, 2015, the entire contents of which are incorporated herein by reference.

FIELD

The embodiments relate to a probe card and a test apparatus including the probe card.

BACKGROUND

A semiconductor test is performed by contacting a probe to a pad provided on a semiconductor substrate.

DETAILED DESCRIPTION

In general, according to one embodiment, there is provided a probe card comprising a probe; and a probe card substrate which includes a first member and a second member, the first member having a first surface provided with the probe and the second member having a second surface surrounding the first surface, wherein a direction of the first surface is different from a direction of the second surface.

First Embodiment

Figure 1:
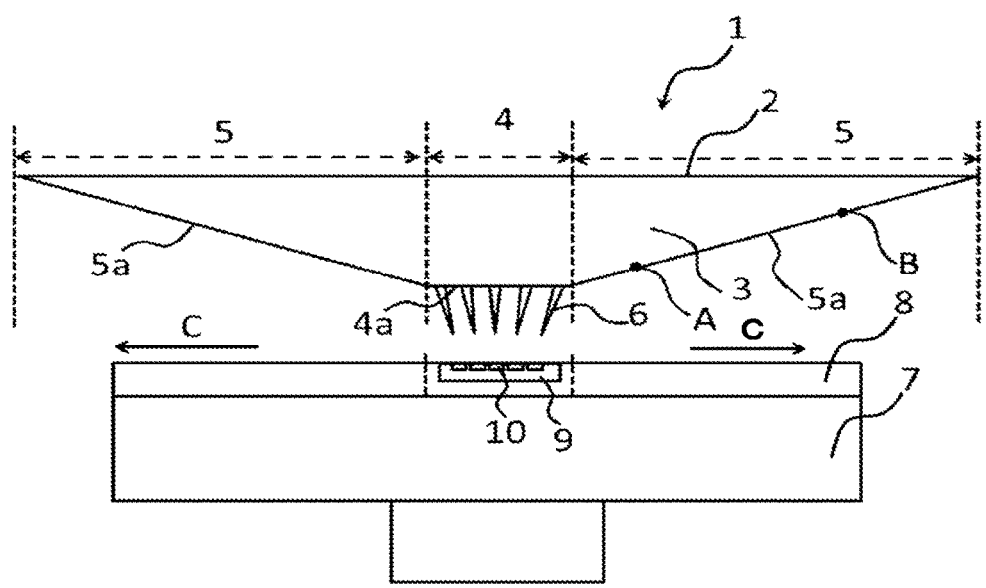
FIG. 1 is a cross sectional view of an apparatus according to a first embodiment.

FIG. 1 schematically shows a test apparatus 1 according to a first embodiment. The test apparatus 1 electrically examines whether or not a circuit element provided on a semiconductor substrate is able to perform a predetermined operation under a condition of high temperature. The test apparatus 1 also enables the examination under a condition at low temperatures, for example, −40° C.

As shown in FIG. 1, the test apparatus 1 includes a probe card 2 and a stage 7 connected to a heater (not shown). The test apparatus 1 examines whether or not a IC chips 9 is formed properly on a wafer 8 during a manufacturing process according to a predetermined design.

Figure 2:
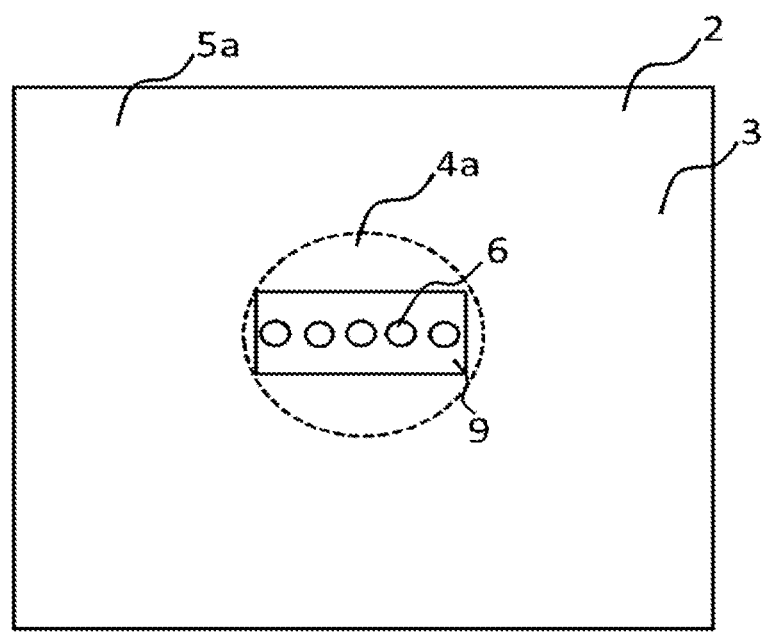
FIG. 2 is a plan view of a surface of the apparatus according to the first embodiment.

FIG. 2 is a plan view from the wafer 8, which is a specimen, showing the probe card 2 applied to the test apparatus 1 according to the first embodiment.

As shown in FIGS. 1 and 2, the probe card 2 includes a probe card substrate 3 and a plurality of probes 6. The probe card substrate 3 includes a first member 4 and a second member 5. The first member 4 of the probe card substrate 3 has a first surface 4a supporting the probes 6. The second member 5 has a second surface 5a surrounding the first surface 4a.

A direction of the first surface 4a of the first member 4 is different from a direction of a second surface 5a of the second member 5. That is, the first surface 4a and the second surface 5a are formed with a certain angle kept between them.

As shown in FIG. 1, the first member 4 has a substantially constant thickness. A thickness of the second member 5 becomes thinner as the second member 5 is more distant from the first member 4 or the probes 6.

For example, if there are, on the second surface 5a, an arbitrary first point (A) and a second point (B) being more distance rather than the first point (a) from the first member 4, the thickness of the second point (B) of the second member 5 is thinner than that of the first point (A) of the second member 5.

The second surface 5a of the second member 5 in the probe card substrate 3 desirably includes a mirror surface. By the second surface 5a being the mirror surface, heat from the heater of the stage 7 efficiently reflects toward an outside of the stage 7 and thereby suppresses a temperature rise of the probe card substrate 3. Suppressing the temperature rise of the probe card substrate 3 results in preventing a thermal expansion of the probe card substrate 3.

The second surface 5a may be a curved surface or a multi-plane surface. The first surface 4a and the second surface 5a need not be directly or continuously connected to each other. Another surface or a space may exist between the first surface 4a and the second surface 5a.

Materials of the probe card substrate 3 may include, for example insulators or ceramics. Thus, the probe card substrate 3 has a low thermal conductivity compared to a probe card substrate including metal conductors.

The probes 6 are arranged in one line on the first surface 4a of the first member 4, for example, as shown in FIG. 2. Directions of the probes 6 are adjusted so that individual positions of the probes 6 are just in contact with a plurality of probe pads 10 provided on each of the IC chips 9.

That is, each of the plurality of probes 6 respectively corresponds to each of the plurality of probe pads 10. According to the present embodiment, the probes 6 are arranged in one line however, the arrangement of the probes 6 is not limited to the above embodiment. For example, the probes 6 may be arranged in matrix or concentrically.

As shown in FIG. 1, the wafer 8 as the specimen can be placed on the stage 7. The stage 7 is connected to the heater (not shown) as mentioned. Thus, the heat from the heater is conducted to the stage 7 and also conducted to the wafer 8 placed on the stage 7 via the stage 7.

Figure 3:
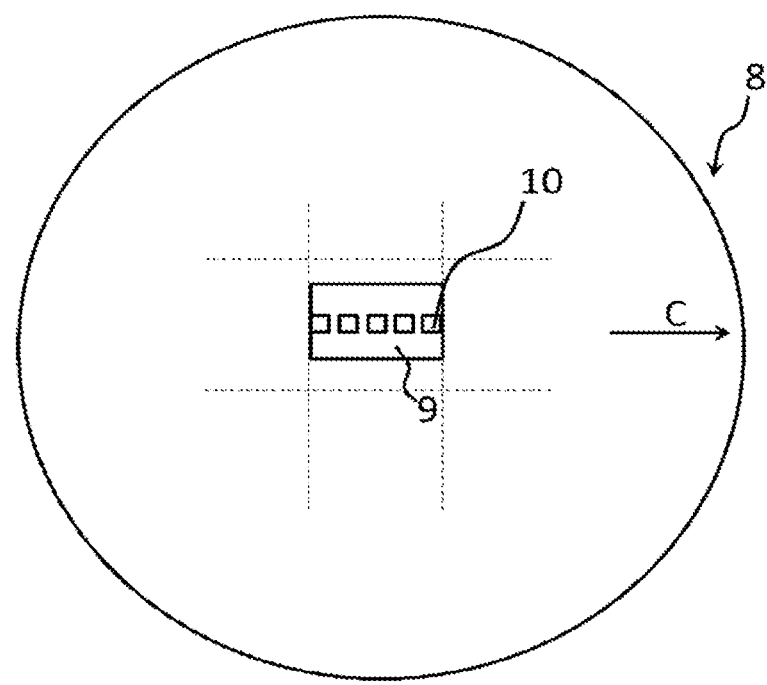
FIG. 3 is a plan view of a wafer served as a specimen applied to the first embodiment.

FIG. 3 is a plan view from the probe card 2 which shows the wafer 8. As shown in FIG. 3, a plurality of IC chips 9 are provided on the wafer 8 and each of IC chips 9 is arranged in one of divided regions of the wafer 8. The probe pads 10 are provided onto each of the IC chips 9.

In accordance with the probe card 2 of the present embodiment, the direction of the first surface 4a of the first member 4 is different from the direction of the second surface of the second member 5.

Figure 4:
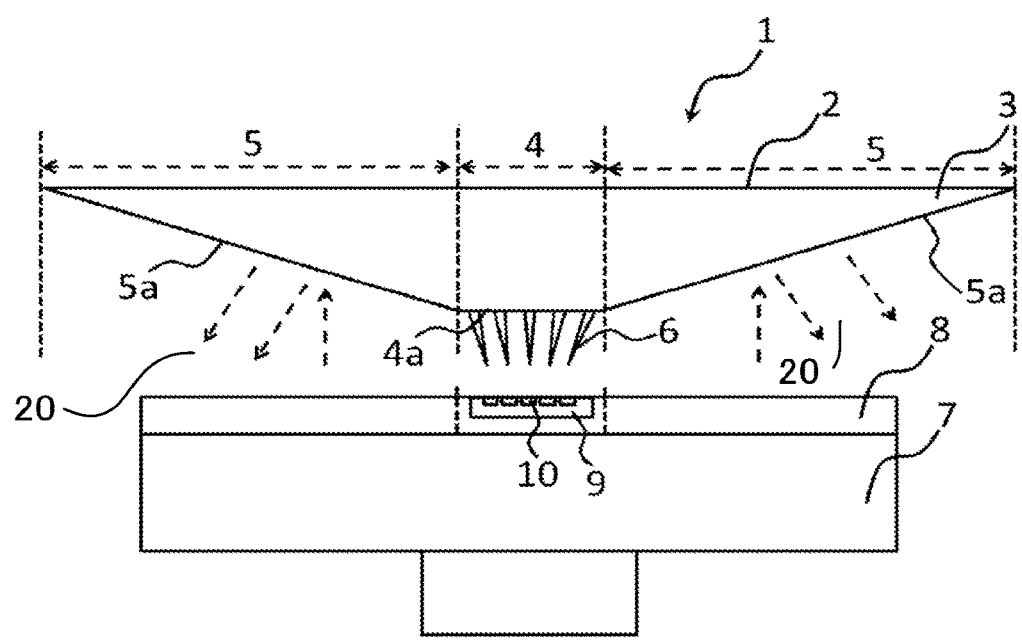
FIG. 4 is a cross sectional view for explaining a heat conduction according to the first embodiment.

Thus, as shown in FIG. 4 heat 20 conducted from the heater of the stage 7 can be released to the edge direction C of the wafer 8. In other words, the heat is efficiently reflects toward outside of the stage 7 as mentioned. The heat release can suppress the thermal expansions of the probe card substrate 3, thereby preventing a position of a leading edge of the probe 6 from being changed.

Accordingly, the probe card 2 of the present embodiment easily obtains proper electrical contact between the probe 6 and the probe pad 10, thereby enabling it to achieve a highly accurate test.

Using the probe card of the embodiment makes an adjustment of the position of the probe easy, thereby enabling to shorten a time of the test and a turnaround time (TAT) for manufacturing products.

Second Embodiment

A test apparatus 1 including a probe card 2 according to a second embodiment further provides a card 11 between the probe card 2 and the stage 7. This is a different point from the first embodiment.

Figure 5:
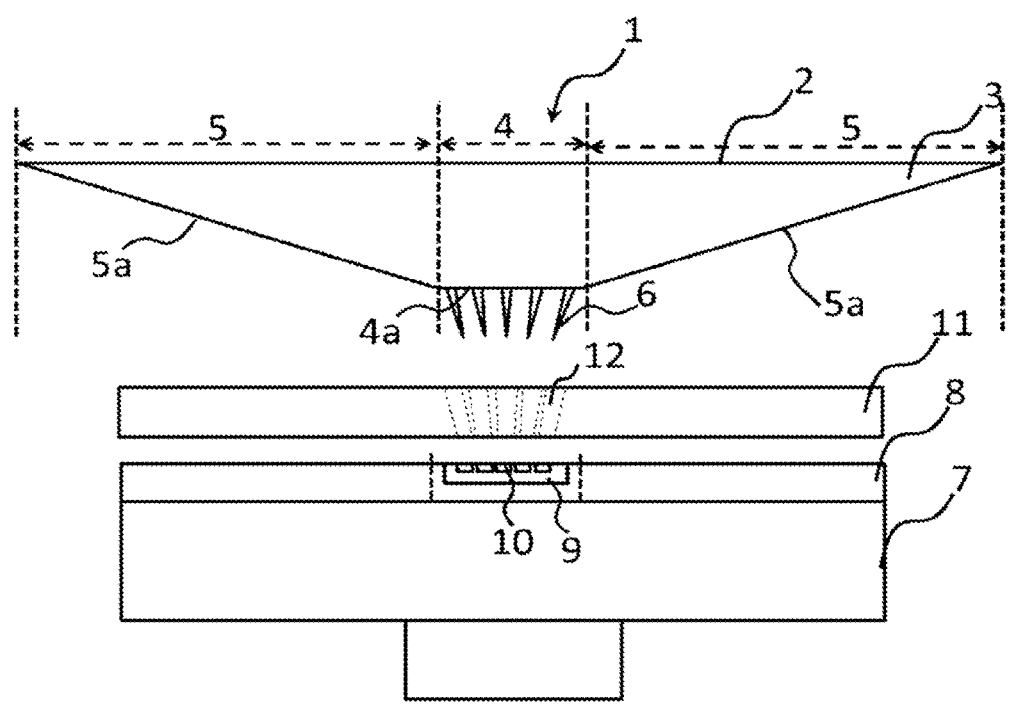
FIG. 5 is a cross sectional view showing the test apparatus 1 according to a second embodiment.
Figure 6:
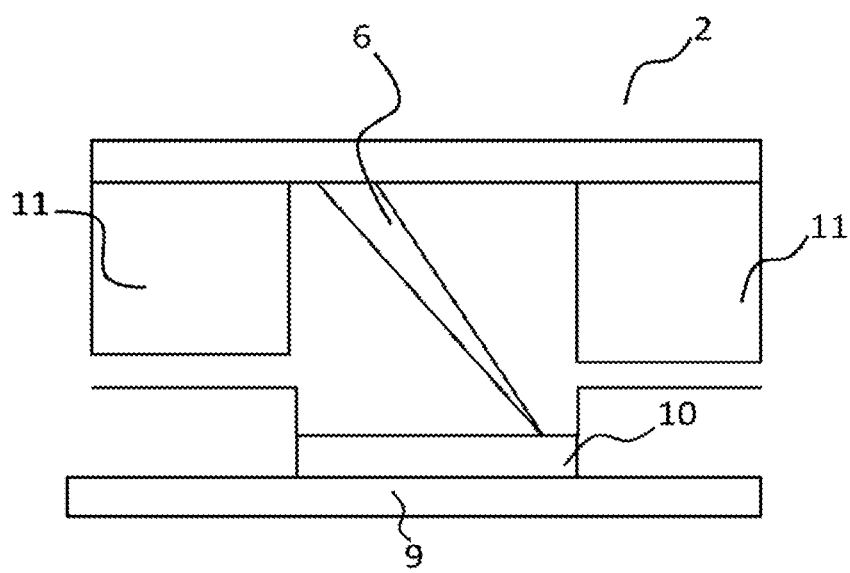
FIG. 6 is an enlarged cross sectional view schematically showing a part of the apparatus 1 according to the second embodiment.

FIGS. 5 and 6 are views showing the test apparatus 1 of the second embodiment. FIG. 6 is an enlarged view schematically showing a part of the apparatus 1 when the probe 6 is placed in contact with the probe pads 10. As shown in FIG. 6, the card 11 is set between the probe card 2 and the stage 7 as mentioned.

A plurality of opening portions 12 are provided to the card 11. Locations of the opening portions 12 correspond to locations of the probes 6 of the probe card 2 and the opening portions 12 serve as a guide for the probes 6. Material of the card 11 may be an insulator or a ceramic.

Thus, the probe 6 and the card 11 are not electrically connected even if they are contacted. The test apparatus 1 can prevent a test-accuracy reduction caused by a contact between the probe 6 and the card 11.

The test apparatus 1 of the second embodiment enables it to adjust the location of the leading edge of the probe 6, by providing the card 11 having the opening portions 12 serving as the guide between the probe 6 and the wafer 8, more accurate than the first embodiment.

For this reason, it is possible to achieve an electric contact between the probe 6 and the probe pad 10 easily and enable to enhance test accuracy.

Modified Example

Figure 7:
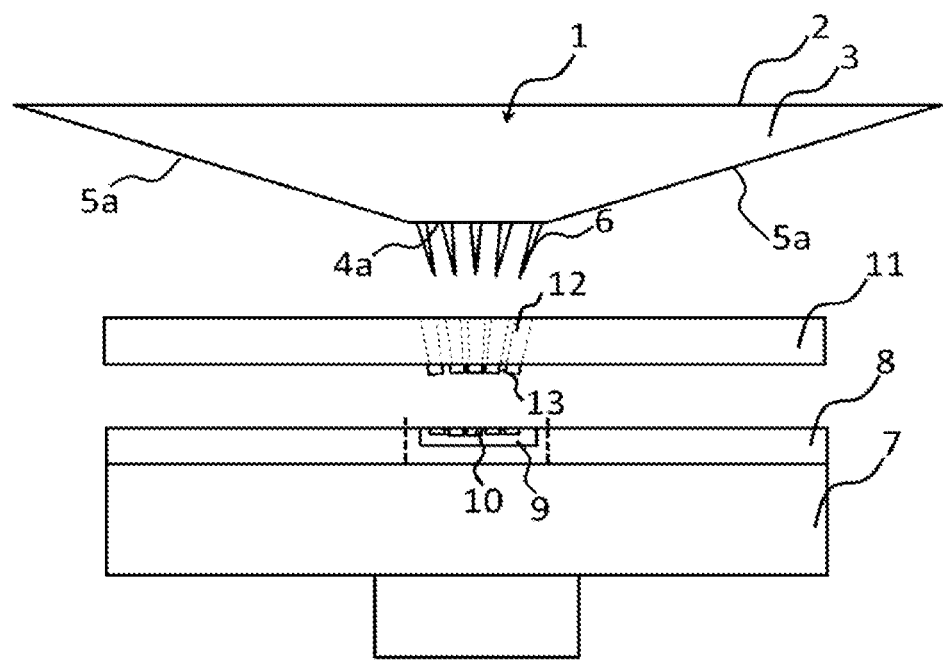
FIG. 7 is across sectional view showing a modified example of the test apparatus 1 of the second embodiment.

FIG. 7 is a sectional view showing a modified example of the test apparatus 1 of the second embodiment. In the modified example, a cylinder portion 13 is further provided to the card 11. The cylinder portion 13 has a cylindrical shape and has almost the same width as the opening portions 12. An opening portion of the cylinder portion 13 is to be attached and unified with one of the opening portions 12 so as to form one opening portion.

According to the modified example of the second embodiment, the test apparatus 1 also enables it to effectively adjust a location of the leading edge of the probe 6 to a predetermined location without making the card 11 thicker.

Thus, an electric contact between the probe 6 and the probe pad 10 is properly achieved, thereby improving the test accuracy. The test apparatus 1 of the modified example also enables to reduce a thickness of the card 11.

That is, according to the example, in which the cylinder portion 13 is provided on the card 11, the accuracy of the test is not so changed compared to the second embodiment even if the thickness of the card 11 is reduced as same as the height of the cylinder portion 13.

By reducing the thickness of the card 11, it is possible to minimize and save the material necessary for the card 11. Or it may also be possible to just attach the cylinder portion 13 to the card 11 in the second embodiment so as to set the guide much longer and make the test much more accurate.

The length of the cylinder 13 may be changeable according to the length of the probe 6 without changing the thickness of the card 11 so as to enhance the effect the adjustment for the positions of the probes 6.

As described above, the embodiments are provided as examples and not intended to limit the scope of the invention. The novel embodiments descried herein may be variously worked, variously skipped, replaced, and modified within the scope of the invention. The embodiments and modifications of the embodiments are included in the scope or summary of the invention. The embodiments and the modifications are also included in the invention or the equivalent invention of the claims.

What is claimed is:

1. A probe card comprising:
   a probe; and
   a probe card substrate which includes a first member and a second member, the first member having a first surface provided with the probe and the second member having a second surface surrounding the first surface;
   wherein a direction of the first surface is different from a direction of the second surface and an angle between the direction of the first surface and the direction of the second surface does not include a right angle.

2. The probe card according to claim 1, wherein the thickness of the second member becomes continuously thinner as the second member is more distant from the probe.

3. The probe card according to claim 1, wherein the second surface includes a mirror finished surface.

4. The probe card according to claim 1, wherein the probe card substrate is an insulator or a ceramic.

5. The probe card according to claim 1, wherein the first surface and the second surface are both provided opposing to a specimen.

6. The probe card according to claim 5, wherein the first surface is provided opposing to a part of the specimen to be tested and contactable with the probe and the second surface is provided to have a certain angle to the first surface.

7. The probe card according to claim 5, wherein the probe card provides a card having a plurality of openings serving as a guide for the probe to contact the probe to the specimen.

8. The probe card according to claim 7, wherein the card is provided between the first and second surfaces and the specimen.

9. The probe card according to claim 7, wherein the probe card has a plurality of probes and the card has a plurality of cylinders at a side of the specimen, each probe corresponding to each opening and each cylinder being respectively on each opening.

10. A test apparatus comprising:
    a stage connected to a heater, the stage being capable of setting a wafer;
    a probe; and
    a probe card substrate including a first member and a second member, the first member having a first surface, the first surface being provided with the probe, the second member having a second surface, the second surface surrounding the first surface;

wherein a direction of the first surface being different from a direction of the second surface and an angle between the direction of the first surface and the direction of the second surface does not include a right angle.

11. The apparatus according to claim 10, wherein the thickness of the second member becomes continuously thinner as the second member is more distant from the probe.

12. The probe card according to claim 11, wherein the first surface is provided opposing to a part of the specimen to be tested and contactable with the probe against the specimen and the second surface is provided to have a certain angle to the first surface.

13. The apparatus according to claim 10, wherein the apparatus provides a card having an opening corresponding to a location of the probe.

14. The apparatus according to claim 13, wherein the card has a cylindrical portion on the opening.

15. The apparatus according to claim 13, wherein the card is an insulator or a ceramic.

16. The probe card according to claim 10, wherein the first surface and the second surface are both provided opposing to a specimen.

17. The apparatus according to claim 11, wherein the apparatus provides a card having an opening corresponding to a location of the probe.

18. A test apparatus comprising:
a stage connected to a heater, the stage being capable of setting a wafer;
a probe; and
a probe card substrate including a first member and a second member, the first member having a first surface, the first surface being provided with the probe, the second member having a second surface, the second surface surrounding the first surface;
wherein a direction of the first surface being different from a direction of the second surface and the thickness of the second member becomes continuously thinner as the second member is more distant from the probe.

19. The apparatus according to claim 18, wherein the apparatus provides a card having an opening corresponding to a location of the probe.

20. The apparatus according to claim 18, wherein the card has a cylindrical portion on the opening.

21. The apparatus according to claim 18, wherein the card is an insulator or a ceramic.

22. The probe card according to claim 18, wherein the first surface and the second surface are both provided opposing to a specimen.

23. The probe card according to claim 18, wherein the first surface is provided opposing to a part of the specimen to be tested and contactable with the probe against the specimen and the second surface is provided to have a certain angle to the first surface.

24. The apparatus according to claim 18, wherein the apparatus provides a card having an opening corresponding to a location of the probe.

* * * * *